(12) United States Patent
Arai

(10) Patent No.: US 6,661,202 B2
(45) Date of Patent: Dec. 9, 2003

(54) DEGRADATION DEGREE COMPUTING METHOD AND UNIT FOR BATTERY

(75) Inventor: Youichi Arai, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/209,913

(22) Filed: Aug. 2, 2002

(65) Prior Publication Data

US 2003/0025506 A1 Feb. 6, 2003

(30) Foreign Application Priority Data

Aug. 3, 2001 (JP) ......................................... 2001-237055

(51) Int. Cl.⁷ .......................... H02J 7/00; G01R 31/36; G01H 27/416

(52) U.S. Cl. .......................... 320/132; 702/63; 324/428

(58) Field of Search ................................. 320/132, 134, 320/135, 149; 324/426, 428, 429, 430; 702/63, 64; 307/10.7; 323/270, 275, 277; 700/286, 50, 67

(56) References Cited

U.S. PATENT DOCUMENTS

| | | | |
|---|---|---|---|
| 5,459,671 A | * 10/1995 | Duley | 702/63 |
| 5,994,877 A | * 11/1999 | Seri et al. | 320/132 |
| 6,262,577 B1 | * 7/2001 | Nakao et al. | 320/135 |
| 6,275,008 B1 | * 8/2001 | Arai et al. | 320/132 |
| 6,285,163 B1 | * 9/2001 | Watanabe et al. | 320/132 |
| 6,388,421 B2 | * 5/2002 | Abe | 320/132 |
| 6,424,157 B1 | * 7/2002 | Gollomp et al. | 324/426 |

* cited by examiner

Primary Examiner—Pia Tibbits
(74) Attorney, Agent, or Firm—Armstrong, Kratz, Quintos, Hanson & Brooks, LLP

(57) ABSTRACT

A base resistance of the battery is obtained by cyclically measuring a discharge current and a voltage between a pair of terminals of the battery, while a rush current is flowing in an electric load electrically connected to the pair of the terminals. The rush current monotonically decreases from a peak to a constant value after the rush current monotonically increases from zero to the peak. A concentration polarization resistance and an activation polarization resistance of the battery are also obtained from the discharge current and the terminal voltage. A degradation degree of the battery is obtained by multiplying the degradation degrees of the base resistance and the polarization resistances together.

4 Claims, 10 Drawing Sheets

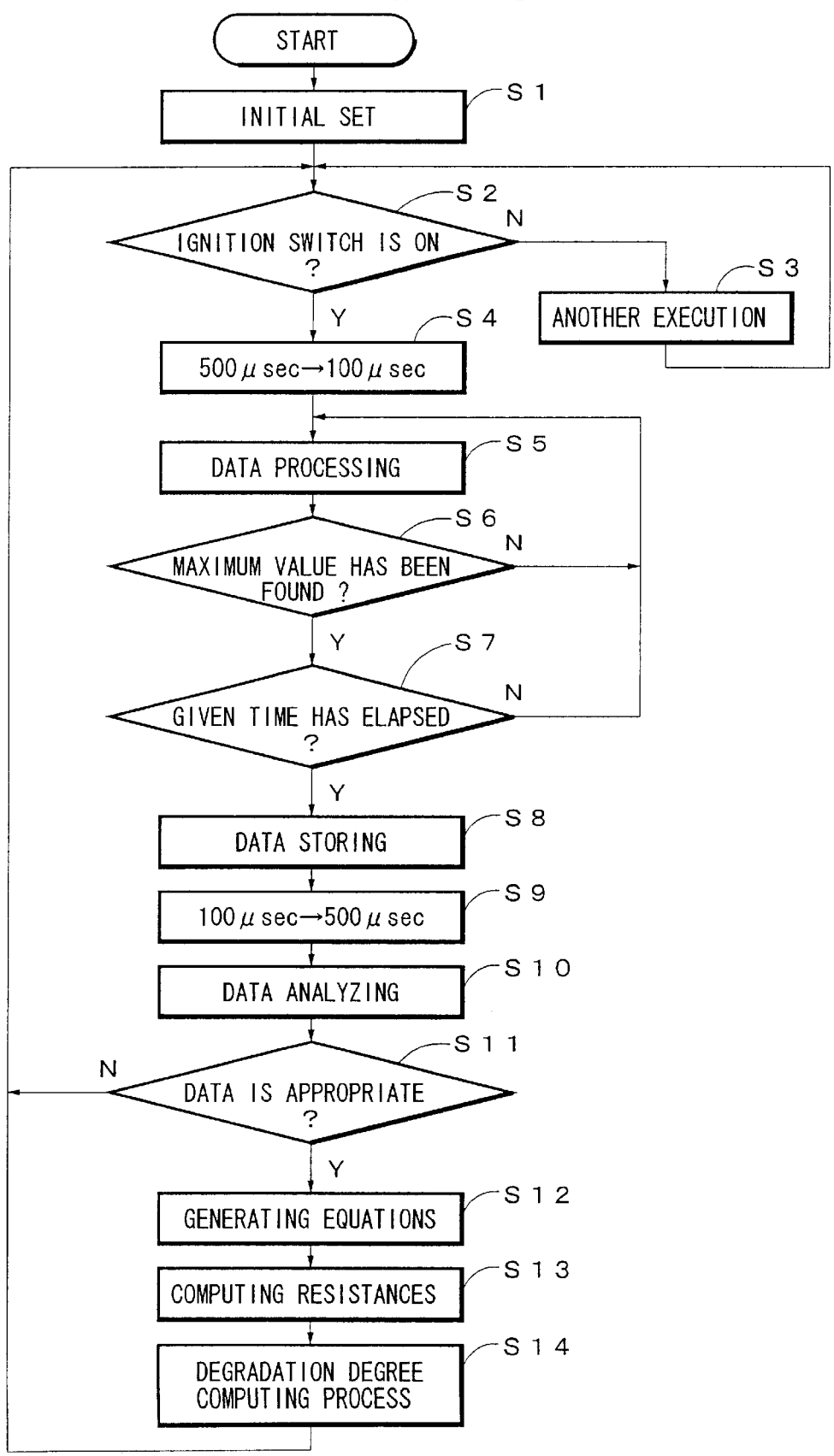

DEGRADATION DEGREE COMPUTING METHOD AND UNIT FOR BATTERY

BACKGROUND OF THE INVENTION

1. Field of the Invention

The present invention relates to a method and a unit for calculating a degradation degree of a battery to supply an electrical power to a load.

2. Related Art

A battery is an electrical source for starting an engine, operating on-vehicle electrical equipment, etc. so that it is important to know a charged state of the battery.

However, the battery repeats charging and discharging, which increases an inner impedance thereof to gradually decrease a discharging capacity and a full charged capacity.

Thus, to correctly know a charged state of the battery, it is necessary to find its present full charging capacity. Therefore, it is important to find a latest degradation state of the battery which appears with its repeated charging and discharging operations.

For knowing the degradation degree of the battery, an original full charging capacity is measured when the battery is new, and the original full charging capacity is compared with a present full charging capacity of the battery. Conventionally, a battery is completely discharged from its full charged state, while a discharge current value and a discharge time are measured to obtain a discharging current capacity which is considered as a present capacity of the battery.

In a vehicle having an ordinary engine and in a hybrid vehicle having a motor generator which acts at an insufficient torque state of an engine, a battery needs to output a large quantity of power at the initial starting of the engine. After the starting, an alternator or the motor generator provides an electrical power to charge the battery into a full charged state during an operation state of the vehicle.

In this vehicle, to know a present full charge capacity of the battery, it is necessary to remove the battery from the vehicle to completely discharge the battery from its full charged state. This work is unpractical and disadvantageous.

Therefore, to monitor a degradation degree of the battery in a state where the battery has been mounted on the vehicle, factors varying with the degradation degree of the battery are measured. This is important to know a present degradation degree of the battery.

One of the factors varying with the degradation degree of the battery is a concentration polarization impedance (combined resistance). The concentration polarization impedance causes a voltage drop between a pair of terminals of the battery. The voltage drop consists of an IR loss (base resistance, i.e. a voltage drop due to an ohmic resistance) and a voltage drop due to a polarization resistance (activation polarization and concentration polarization) related to a chemical reaction.

Thus, a present degradation degree of the battery can be known by monitoring how the base resistance, the activation polarization, and the concentration polarization resistance vary from their original values to drop the terminal voltage of the battery.

A degradation of such a battery is due to increase of the base resistance, the activation polarization resistance, or the concentration polarization resistance. Therefore, it is insufficient to find only one of the degradations to determine the state of the battery. For example, the base resistance varies little in a charged state (SOC) more than 40%, while the base resistance varies sharply in a SOC less than 40%. In the meantime, the activation polarization resistance and the concentration polarization resistances increase apparently even in a SOC more than 40%.

Thus, the base resistance, the activation polarization resistance, and the concentration polarization resistance do not vary with an apparent regularity in connection to the degradation degree of the battery. However, there are relations among the base resistance, the activation polarization resistance, and the concentration polarization resistance. Therefore, it is necessary for determining a correct degradation state of the battery to monitor all of the base resistance, the activation polarization resistance, and the concentration polarization resistance.

SUMMARY OF THE INVENTION

In view of the aforementioned situation, an object of the invention is to provide a method and a unit for determining a degradation degree of a battery to supply an electrical power to a load. The method considers relations among a base resistance, a activation polarization resistance, and a concentration polarization resistance of the battery. A measurement of the battery is made while the battery is kept at a usage position.

A first aspect of the invention is a degradation degree computing method for a battery for supplying an electrical power to a load, the method comprising the steps of:

a first step for obtaining a base resistance of the battery by cyclically measuring a discharge current and a voltage between a pair of terminals of the battery while a rush current is flowing in an electric load electrically connected to the pair of the terminals, the rush current simply decreasing from a peak to a constant value after the rush current simply increases from zero to the peak, a second step for obtaining at least one of a concentration polarization resistance and an activation polarization resistance of the battery from the discharge current and the terminal voltage that are measured in the first step, a third step for obtaining a degradation degree of the base resistance which is a ratio of the base resistance obtained by the first step to an original base resistance of the battery, a fourth step for obtaining a polarization resistance degradation degree which is a ratio of one of the concentration polarization resistance and the activation polarization resistance to an original polarization resistance, and a fifth step for obtaining a degradation degree of the battery by multiplying the degradation degrees of the base resistance and the polarization resistance together. Thus, even when there is a relation between the base resistance and the polarization resistance, the degradation degree of the battery is calculated to include the relation.

Preferably, the second step obtains each of a concentration polarization resistance and an activation polarization resistance of the battery, and the fourth step obtains a concentration polarization resistance degradation degree which is a ratio of the concentration polarization resistance obtained in the second step to an original concentration polarization resistance of the battery, the fourth step also obtaining an activation polarization resistance degradation degree which is a ratio of the activation polarization resistance obtained in the second step to an original activation polarization resistance of the battery, wherein the polarization resistance degradation degree of the fifth step is obtained by multiplying the degradation degrees of the concentration polarization resistance and the activation polarization resistance together. Thus, even when there is a relation between the concentration polarization resistance degradation and the activation polarization resistance degradation, the degradation degree of the battery is calculated in consideration of the relation.

A second aspect of the invention is a degradation degree computing unit of a battery for supplying an electrical power to a load. As illustrated in FIG. 1, the unit includes:

a measuring means 23a-1 for measuring a discharge current and a voltage between a pair of terminals of the battery while a rush current is flowing in an electric load electrically connected to the pair of the terminals, the rush current simply decreasing from a peak to a constant value after the rush current simply increases from zero to the peak, a base resistance computing means 23a-2 for obtaining a base resistance of the battery from the discharge current and the voltage that are measured by the measuring means, a polarization resistance computing means 23a-3 for obtaining at least one of a concentration polarization resistance and an activation polarization resistance of the battery from the discharge current and the terminal voltage that are measured by the measuring means, a base resistance degradation degree computing means 23a-4 for obtaining a degradation degree of the base resistance which is a ratio of the base resistance obtained by the first step to an original base resistance of the battery, a polarization resistance degradation degree computing means 23a-5 for obtaining a polarization resistance degradation degree which is a ratio of one of the concentration polarization resistance and the activation polarization resistance to an original polarization resistance, and a battery degradation degree computing means 23a-6 for obtaining a degradation degree of the battery by multiplying the degradation degrees of the base resistance and the polarization resistance together. Thus, even when there is a relation between the base resistance and the polarization resistance, the degradation degree of the battery is calculated in consideration of the relation.

Preferably, the polarization resistance computing means calculates each of a concentration polarization resistance and an activation polarization resistance of the battery, and the polarization resistance degradation degree computing means calculates a concentration polarization resistance degradation degree which is a ratio of the concentration polarization resistance obtained in the second step to an original concentration polarization resistance of the battery, the polarization resistance degradation degree computing means also calculating an activation polarization resistance degradation degree which is a ratio of the activation polarization resistance obtained in the second step to an original activation polarization resistance of the battery, wherein the battery degradation degree computing means obtains a degradation degree of the battery by multiplying the degradation degrees of the base resistance, the concentration polarization, and the activation polarization one another. Thus, even when there is a relation between the concentration polarization resistance degradation degree and the activation polarization resistance degradation degree, the degradation degree of the battery is calculated in consideration of the relation.

For example, the original base resistance is obtained from one of computing methods described hereinafter.

In a first computing method for obtaining the base resistance of the battery, a discharge current and a voltage between a pair of terminals of the battery are measured while a rush current is flowing in an electric load electrically connected to the pair of the terminals, the rush current simply decreasing from a peak to a constant value after the rush current simply increases from zero to the peak. A first approximate equation showing a correlation between the current and the voltage is obtained in a region where the discharge current is increasing, and a second approximate equation showing a correlation between the current and the voltage is obtained in a region where the discharge current is decreasing. A voltage drop due to the concentration polarization of the battery is considered to be deducted from the first and second approximate equations if necessary. At the peak of the rush current, a differential of the voltage relative to the current is obtained for each of the first and second approximate equations. An intermediate value of thus obtained voltage differentials is determined as the base resistance of the battery. Thus, in a normal operation state of the load, an electrical power is supplied to the load to measure a terminal voltage and a discharge current of the battery. This can obtain a base resistance of the battery.

In a second computing method for obtaining the base resistance of the battery, the obtained voltage differentials are averaged to obtain the base resistance of the battery. Thus, when each of the first and second approximate equations gives a differential substantially the same as each other regarding the activation polarization at the peak, a mean value of differentials of the first and second approximate equations at the peak point is determined as the base resistance of the battery.

In a third computing method for obtaining the base resistance of the battery, the voltage differentials obtained by the first computing method are averaged to determine the base resistance in consideration of lengths of the increasing and decreasing regions of the rush current. Thus, the intermediate value is obtained in consideration of a relation between the activation polarization and the concentration polarization to obtain the base resistance of the battery.

In a fourth computing method for obtaining the base resistance of the battery, each of the first and second approximate equations is a quadratic equation. Thus, the intermediate value is calculated from differentials of the first and second approximate equations at the peak point to obtain the base resistance of the battery.

In a fifth computing method for obtaining the base resistance of the battery, according to each of the first and second approximate equations of the fourth computing method, a terminal voltage is calculated at a zero point of the discharge current. The difference between the two voltages is considered to be a voltage drop due to a concentration polarization of the battery. Constant coefficients of the first approximate equation are determined by deducting the voltage drop due to the concentration polarization of the battery. Thus, a first approximate equation, in which an effect of the concentration polarization of the battery is correctly removed, is obtained.

In a sixth computing method for obtaining the base resistance of the battery which is a modification of the fifth computing method, constant coefficients of the second approximate equation are determined from three voltage values between zero and the peak of the discharge current including a voltage value at the peak. Thus, the second approximate equation, in which a voltage drop of the concentration polarization of the battery is removed, is obtained with ease.

In a seventh computing method for obtaining the base resistance of the battery which is a modification of the sixth computing method, the intermediate value which is determined as the base resistance may be obtained in consideration of differentials of the first and second approximate equations at the peak. Thus, the base resistance is calculated with ease.

In an eighth computing method for obtaining the base resistance of the battery which is a modification of the sixth computing method, constant coefficients of the second approximate equation are determined from three voltage values between zero and the peak of the discharge current including a voltage value at the zero point of the discharge current. Thus, the zero point which includes basically no effect of the concentration polarization is effectively used for obtaining the approximate equation.

In a ninth computing method for obtaining the base resistance of the battery which is a modification of the fifth computing method, a voltage is obtained at a middle point between zero and the peak of the discharge current. A line connecting the peak point with the middle point may be utilized to interpolate the intermediate value. Thus, the intermediate value is calculated with ease.

In a tenth computing method for obtaining the base resistance of the battery which is a modification of the fifth computing method, a first current-time integral is calculated between zero and the peak of the discharge current, and a second current-time integral is calculated between the zero point and a distal zero point positioned after the peak of the discharge current. A ratio of the current-time integral to the second current-time integral is calculated. The voltage drop between the initial zero point and the peak due to the concentration polarization maybe obtained by multiplying the ratio and the difference of the voltages obtained by the first and second approximate equations at the initial zero point of the discharge current. Thus, a voltage at the peak, which does not include a voltage drop due to the concentration polarization of the battery, is obtained.

In an eleventh computing method for obtaining the base resistance of the battery which is a modification of the first computing method, when the load provides a rush current which increases linearly up to the peak within a short time without occurrence of a concentration polarization, the first approximate equation is linear. The linear equation may be used to obtain the intermediate value. Thus, the approximate equation and the intermediate value are obtained with ease.

For example, original and present concentration polarization resistance values of a battery are obtained from one of computing methods described hereinafter.

In a first computing method for obtaining the concentration polarization resistance of the battery, a discharge current and a voltage between a pair of terminals of the battery are measured while a rush current is flowing in an electric load electrically connected to the pair of the terminals, the rush current simply decreasing from a peak to a constant value after the rush current simply increases from zero to the peak. A first approximate equation showing a correlation between the current and the voltage is obtained in a region where the discharge current is increasing, and a second approximate equation showing a correlation between the current and the voltage is obtained in a region where the discharge current is decreasing. A voltage is obtained from each of the first and second approximate equations at a point where the discharge current is zero. The deference between the two voltages obtained by the first and second approximate equations at the point where the discharge current is zero is calculated. The deference is determined to be a total voltage drop due to a concentration polarization of the battery. The concentration polarization occurs with the rush current. A voltage drop due to the concentration polarization at any point of the discharge current is obtained in use of the deference. From the voltage drop, a concentration polarization resistance value of the battery is obtained at any point of the discharge current.

In a second computing method for obtaining the concentration polarization resistance of the battery, a voltage drop due to the concentration polarization at the peak of the rush current is obtained in use of the deference. A concentration polarization resistance is calculated from the voltage drop.

In a third computing method for obtaining the concentration polarization resistance of the battery, a discharge current and a voltage between a pair of terminals of the battery are measured while a rush current is flowing in an electric load electrically connected to the pair of the terminals, the rush current simply decreasing from a peak to a constant value after the rush current simply increases from zero to the peak. A first approximate equation showing the correlation between the current and the voltage is obtained in a region where the discharge current is increasing, and a second approximate equation showing a correlation between the current and the voltage is obtained in a region where the discharge current is decreasing. Each voltage is obtained from each of the first and second approximate equations at a point where the discharge current is zero. The deference between the two voltages at the point where the discharge current is zero is calculated. The deference is determined to be a total voltage drop due to a concentration polarization of the battery. A voltage drop at the peak due to a concentration polarization of the battery is obtained by multiplying the total voltage drop by a time ratio which is a ratio of an increasing time from zero to the peak of the rush current to a total time corresponding to the total voltage drop. A voltage drop due to the concentration polarization at any point of the discharge current between the initial zero point and the peak is obtained in use of the voltage drop value at the peak in use of a linear relation of the voltage and a corresponding elapsed time. From the voltage drop, a concentration polarization resistance value of the battery is obtained at any point of the discharge current between the initial zero point and the peak.

In a fourth computing method for obtaining the concentration polarization resistance of the battery, a voltage drop due to the concentration polarization at any point of the discharge current between the peak and the last zero point is obtained from the voltage drop value at the peak in use of the linear relation of the voltage and a corresponding time elapsed from the peak.

Concerning the first to fourth computing methods for obtaining the concentration polarization resistance of the battery, a voltage drop due to factors other than the concentration polarization can be calculated. The voltage drop is obtained by deducting a voltage drop due to a concentration polarization of the battery from the first and second approximate equations.

For example, original and present activation polarization resistance values of a battery are obtained by a computing method described hereinafter.

In the first and second approximate equations obtained in the fifth concentration polarization resistance computing method, a voltage drop due to a base resistance of the battery is deducted. Thus, first and second approximate equations for a voltage drop due to the activation polarization of the battery are obtained. Thereby, a voltage deduction and an associated activation polarization value at any current point due to the activation polarization can be easily calculated in use of the first and second approximate equations.

For example, an original base resistance and a base resistance with a degradation degree are obtained from a computing device described hereinafter.

As illustrated in a basic block diagram of FIG. 2, a computing device for obtaining a base resistance of the battery has a current and voltage measuring means 23a-1 for cyclically measuring a discharge current and a voltage between a pair of terminals of the battery, while a rush current is flowing in an electric load electrically connected to the pair of the terminals, the rush current simply decreasing from a peak to a constant value after the rush current simply increases from zero to the peak. The computing device further has an approximate equation generating means 23a-7 including a first approximate equation showing a correlation between the current and the voltage in a region where the discharge current is increasing and a second approximate equation showing a correlation between the current and the voltage in a region where the discharge current is increasing. A voltage drop due to a concentration polarization of the battery is deducted from the first and second approximate equation if necessary. At the peak of the rush current, a differential of the voltage relative to the current is obtained for each of the first and second approximate equations. The computing device further has a base resistance computing means 23a-8 in which a intermediate value of thus obtained voltage variations is determined as a base resistance of the battery. Thus, in a normal operation state of the load, an electrical power is supplied to the load to measure a terminal voltage and a discharge current of the battery. This can give a base resistance of the battery.

For example, a concentration polarization resistance of a battery is obtained in its original or present state from one of computing devices described hereinafter.

In a first computing device for obtaining a concentration polarization resistance of the battery, as shown in a basic block diagram of FIG. 3, a current and voltage measuring means 23a-1 obtains a discharge current and a voltage between a pair of terminals of the battery while a rush current is flowing in an electric load electrically connected to the pair of the terminals, the rush current simply decreasing from a peak to a constant value after the rush current simply increases from zero to the peak. The first computing device further has an approximate equation generating means 23a-7 including a first approximate equation showing a correlation between the current and the voltage in a region where the discharge current is increasing and a second approximate equation showing a correlation between the current and the voltage in a region where the discharge current is decreasing. The first computing device further has a concentration polarization resistance computing means 23a-9, in which each voltage is obtained from each of the first and second approximate equations at a point where the discharge current is zero. The deference between the two voltages at the point where the discharge current is zero is calculated. The deference is determined to be a total voltage drop due to a concentration polarization of the battery. The concentration polarization occurs with the rush current. A voltage drop due to the concentration polarization at any point of the discharge current is obtained in use of the deference. From the voltage drop, a concentration polarization resistance value of the battery is obtained at any point of the discharge current.

In a second computing device for obtaining the concentration polarization resistance of the battery, as shown in a basic block diagram of FIG. 3, a current and voltage measuring means 23a-1 obtains a discharge current and a voltage between a pair of terminals of the battery while a rush current is flowing in an electric load electrically connected to the pair of the terminals, the rush current simply decreasing from a peak to a constant value after the rush current simply increases from zero to the peak. The second computing device further has an approximate equation generating means 23a-7 including a first approximate equation showing a correlation between the current and the voltage in a region where the discharge current is increasing and a second approximate equation showing a correlation between the current and the voltage in a region where the discharge current is decreasing. The second computing device further has a concentration polarization resistance computing means 23a-10, in which each voltage is obtained from each of the first and second approximate equations at a point where the discharge current is zero. The deference between the two voltages at the point where the discharge current is zero is calculated. The deference is considered to be as a total voltage drop due to a concentration polarization of the battery. A voltage drop at the peak due to a concentration polarization of the battery is obtained by multiplying the total voltage drop by a time ratio which is a ratio of an increasing time from zero to the peak of the rush current to a total time corresponding to the total voltage drop. A voltage drop due to the concentration polarization at any point of the discharge current between the initial zero point and the peak may be obtained from the voltage drop value at the peak in use of a linear relation of the voltage and a corresponding elapsed time. From the voltage drop, a concentration polarization resistance value of the battery is obtained at any point of the discharge current between the initial zero point and the peak.

For example, an activation polarization resistance of a battery is obtained in its original or present state from one of computing devices described hereinafter As illustrated in a block diagram of FIG. 4, an activation polarization resistance computing device has a modified approximate equation generating means 23a-11 for providing first and second approximate equations which are obtained by deducting a voltage drop due to the concentration polarization from the first and second approximate equations. The activation polarization resistance computing device has a concentration polarization approximate equation generating means 23a-12 including concentration polarizations approximate equations which are obtained by deducting each of the first and second approximate equations of the modified approximate equation generating means 23a-11 from each of the first and second approximate equations of the approximate equation generating means 23a-7. The concentration polarization approximate equations can give a voltage drop due to the concentration polarization at any current point of the battery. The activation polarization resistance computing device further has an approximate equation generating means 23a-13 for obtaining first and second activation polarization approximate equations by deducting a voltage reduction due to the base resistance from the first and second approximate equations provided by the modified approximate equation generating means 23a-11. The activation polarization resistance computing device further has an activation polarization resistance computing means 23a-14 for obtaining an activation polarization resistance value of the battery at a desired current. That is, a voltage drop at the desired current is calculated by the approximate equation of the activation polarization, and an activation polarization resistance is calculated from the voltage drop.

As mentioned above, each voltage is obtained from each of the first and second approximate equations at a point where the discharge current is zero. The deference between the two voltages at the point where the discharge current is zero is calculated. The deference is determined to be a total voltage drop due to a concentration polarization of the battery. A voltage drop at the peak due to a concentration polarization of the battery is obtained by multiplying the total voltage drop by a time ratio which is a ratio of an increasing time from zero to the peak of the rush current to a total time corresponding to the total voltage drop. A voltage drop due to the concentration polarization at any point of the discharge current between the initial zero point and the peak is obtained from the voltage drop value at the peak in use of a linear relation of the voltage and a corresponding elapsed time. From the voltage drop, a concentration polarization resistance value of the battery is obtained at any point of the discharge current between the initial zero point and the peak.

BRIEF DESCRIPTION OF THE DRAWINGS

FIG. 13 is a flowchart showing processes executed by a micro computer under control of a program for calculating a degradation degree of the battery.

DETAILED DESCRIPTION OF PREFERRED EMBODIMENTS

Referring to the accompanied drawings, a method and a unit for calculating a degradation degree of a battery mounted on a motor vehicle will be discussed. First, referring to FIGS. 6 to 12, computing methods for obtaining a base resistance, a concentration polarization resistance, and an activation polarization resistance of the battery will be discussed in detail.

A vehicle has a battery for supplying an electric power to loads mounted on the vehicle. The battery has generally a normal output voltage of 12V or 42V. The vehicle may be an EV (electric vehicle) or a HEV (hybrid electrical vehicle). Such vehicles have an electric load requiring a larger current like a stator motor, a motor generator, or a vehicle driving motor. For example, after a larger current electric load like a starter motor is turned on, a rush current flows through the electric load at an initial step of the starting. Then, the current flowing through the electric load becomes constant according to a capacity of the electric load.

Figure 6:
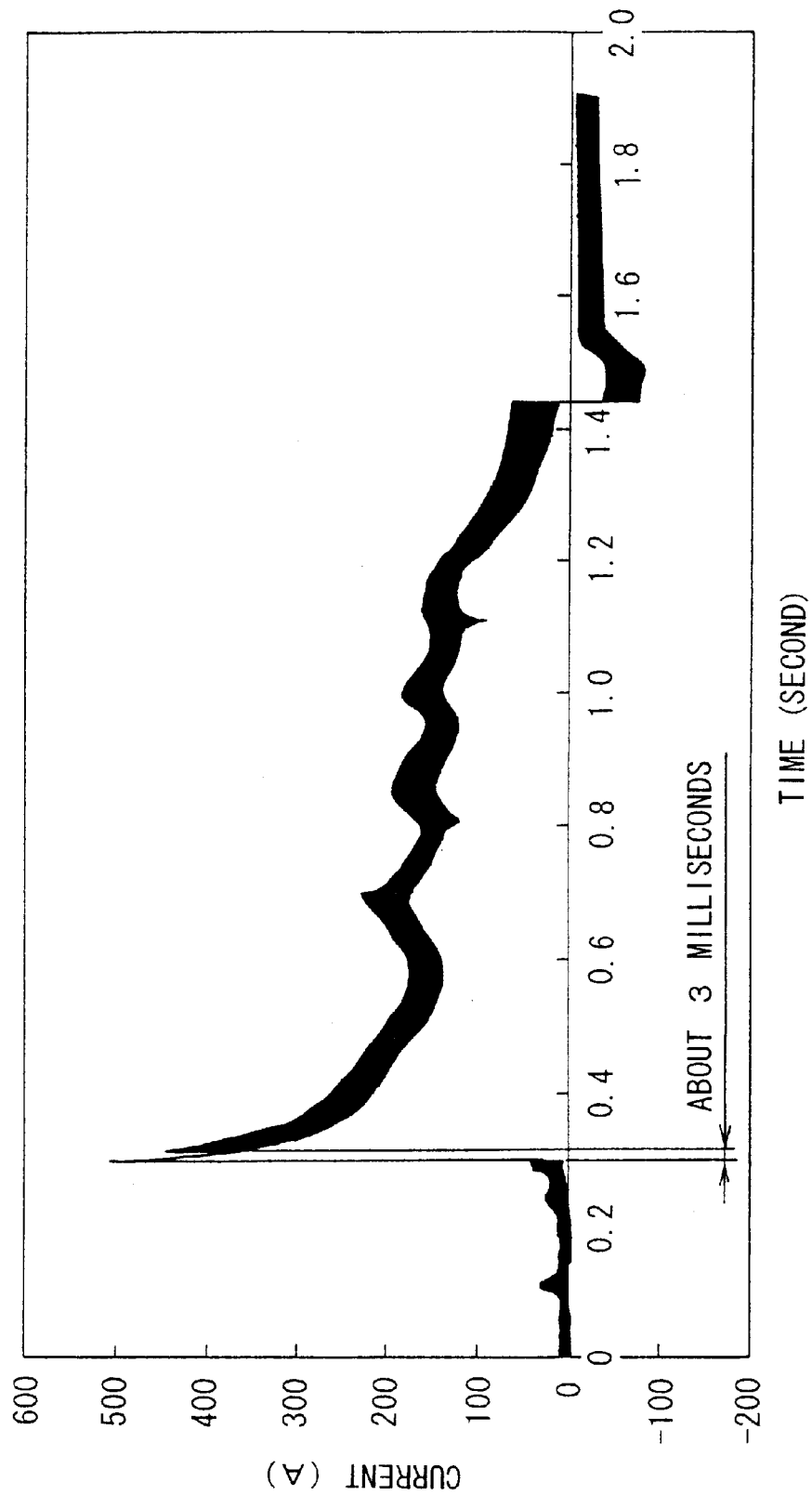
FIG. 6 is a graph of a discharge current of a battery with a rush current which occurs at a starting operation of a starter motor.

When the starter motor is a DC motor, a rush current flowing through a field coil of the motor is illustrated in FIG. 6. The rush current increases sharply up to a peak, e.g. of 500 A (ampere) during a short period, e.g. of 3 milliseconds just after the starting of the electric load. The peak value is several times a normal constant current. The rush current deceases from the peak to the constant value during a comparatively short period, e.g. of 150 milliseconds, which is a discharge current supplied from a battery. In a state where a rush current is flowing through the electric load, a discharge current and a corresponding voltage between a pair of terminals of the battery are measured. Thereby, a correlation between the discharge current (I) and the terminal voltage (V) of the battery is obtained, which shows the terminal voltage varying with the discharge current in a wide region of the discharge current.

Figure 7:
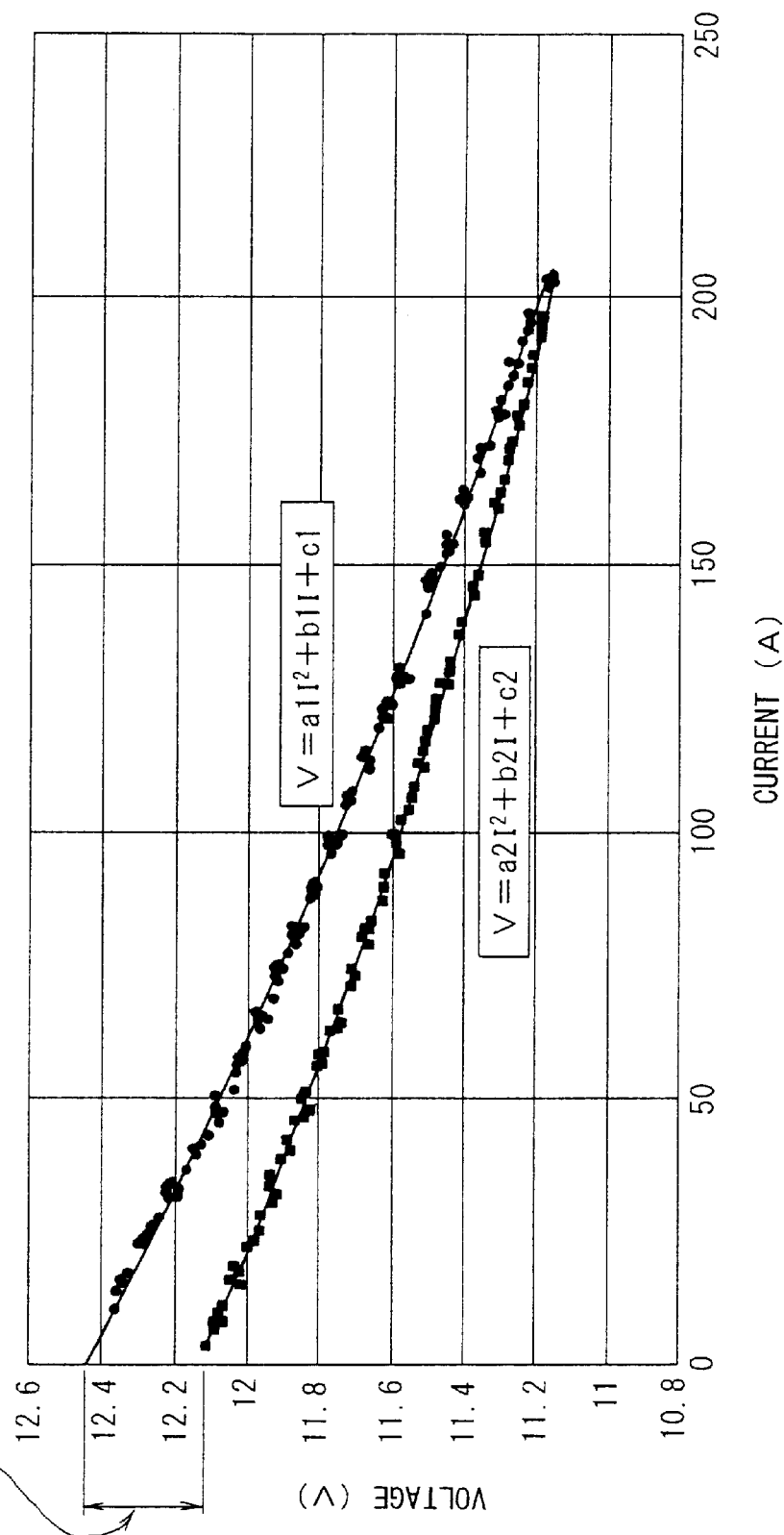
FIG. 7 is a graph showing a relation between a current and a voltage of the battery, the relation being given by approximate quadratic equations.

A discharge pattern of the battery, which is similar to when the starter motor is turned on, is carried out by an experimental controlled load. In the pattern, the discharge current increases from zero to about 200 A during 0.25 seconds and decreases from the peak to zero during 0.25 seconds. At the same time, a discharge current and a corresponding terminal voltage of the battery are measured at short intervals to obtain a data to provide a graph of FIG. 7. In FIG. 7, a horizontal ordinate shows a discharge current, and a vertical ordinate shows a terminal voltage of the battery. The relation between the discharge current and the terminal voltage is given by the following quadratic equations each for a increasing period or a decreasing period of the discharge current.

$$V = a1 I^2 + b1 I + c1 \quad (1)$$

$$V = a2 I^2 + b2 I + c2 \quad (2)$$

The quadratic approximate equations are also illustrated in FIG. 7.

In FIG. 7, a voltage deference between the approximate equations (1) and (2) when the discharge current is zero includes neither a voltage drop due to a base resistance and an activation polarization of the battery. Thus, the voltage deference at the zero current is determined to be a voltage drop due to a concentration polarization of the battery. The voltage difference at the zero current is designated by $Vpolc0$.

Next, a method for calculating a concentration polarization at the peak of the rush current in use of $Vpolc0$ will be discussed. $VpolcP$ designates a voltage drop due to a concentration polarization when the discharge current is at the peak.

$$VpolcP = [(Asec \text{ in current increasing region})/(Asec \text{ in all discharge current region})] \times Vpolc0 \quad (3)$$

where

Asec: integral of current value and time

Note that Asec in all discharge current region=(Asec in current increasing region)+(Asec in current decreasing region)

Generally, the discharge current varies linearly with an elapsed time in each of the increasing and decreasing regions. Thus, Vpolc0 is divided into a voltage drop due to a concentration polarization in the discharge current increasing region and a voltage drop due to a concentration polarization in the discharge current decreasing region. That is, $$VpolcP=[Tz/Ts] \times Vpolc0 \qquad (3')$$

where
  Tz: time of the discharge current increasing region
  Tg: time of the discharge current decreasing region
  Ts: the sum of Tz and Tg
  VpolcP=Vpolc0 /2, when Tz is equal to Tg Thus obtained VpolcP is multiplied by a ratio of an elapsed time tz at any current point to Tz to obtain a voltage drop due to a concentration polarization of the battery within the discharge current increasing region. In the meantime, a voltage drop due to a concentration polarization of the battery within the discharge current decreasing region will be calculated in use of Vpolc0, Ts, and an elapsed time up to at any current point.

Figure 8:
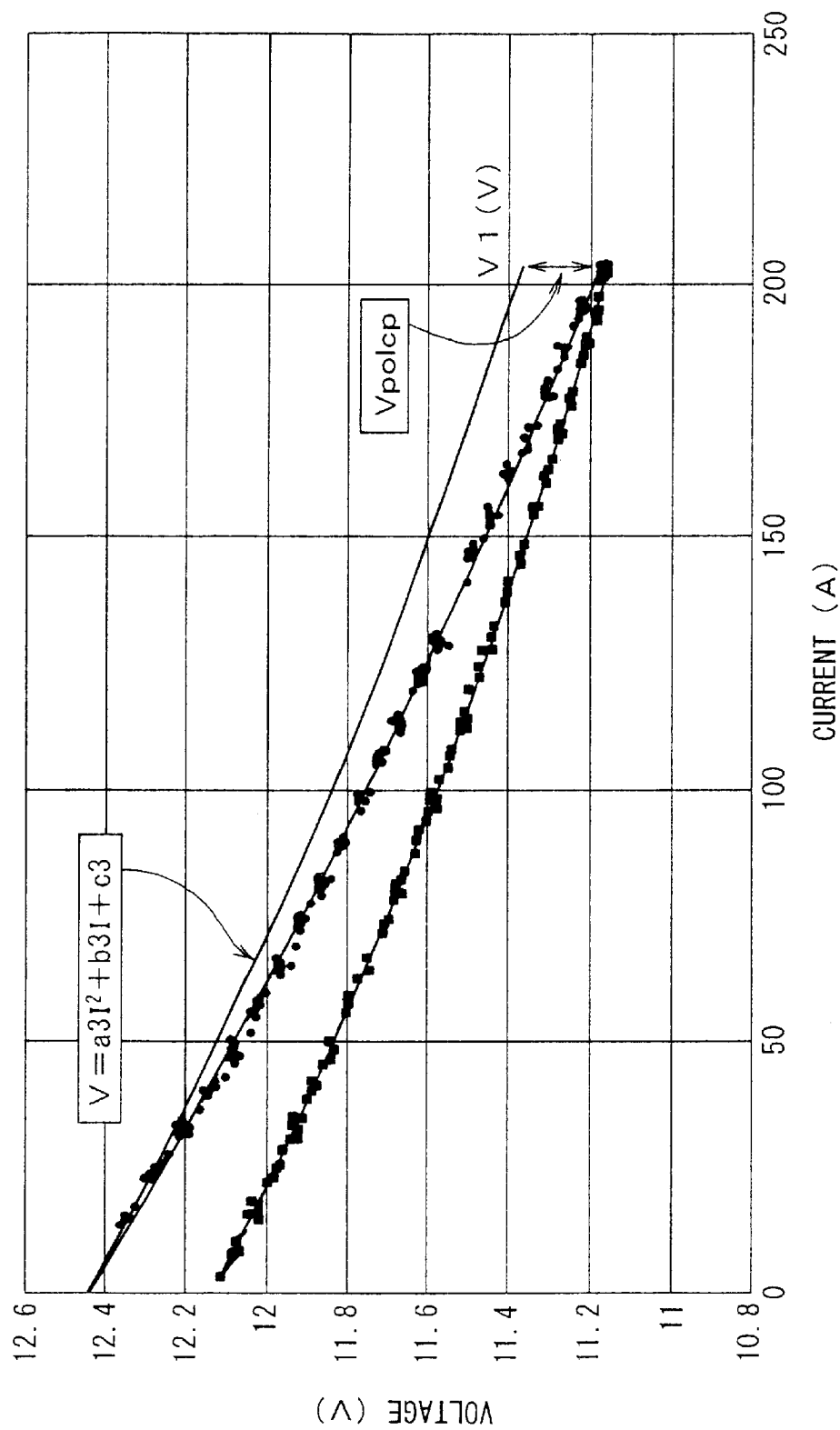
FIG. 8 is a graph particularly showing how to deduct a voltage drop due to a concentration polarization of the battery from one of the approximate equations within a current increasing region.

As illustrated in FIG. 8, thus obtained VpolcP is added to a voltage at the maximum current in equation (1) to obtain V1 which does not include a voltage drop due to a concentration polarization of the battery.

That is, $$V1=a1Ip^2+b1Ip+c1+VpolcP$$

Ip designates a current at the peak.

Next, in use of thus obtained V1, a voltage drop curve due to only the base resistance and the activation polarization is developed as illustrated in FIG. 8.

$$V1=a3I^2+b3I+c3 \qquad (4)$$

Regarding equations (1) and (4), when the discharge current is zero (A), the voltages of equations (1) and (4) are same, so that c3 is equal to c1. A reaction of the concentration polarization in an initial increasing stage of the discharge current is slow so that a differential of equation (1) is equal to a differential of equation (4) at zero (A) point of the current. Thus, b3 is equal to b1. Equation (4) is rewritten by substituting c3=C1 and b3=b1 to obtain the following equation.

$$V1=a3I^2+b1I+c1 \qquad (5)$$

Thus, an unknown constant is only a3.

Therefore, ordinates (Ip, V1) at the peak of the current are substituted in equation (5) to obtain the constant a3.

$$a3=(V1-b1Ip-c1)/Ip^2$$

Accordingly, a voltage drop due to only the base resistance and the activation polarization is determined by employing equations (4) and (5).

In use of thus obtained equations (5) and (1), the following approximate equation is given for determining a voltage drop due to the concentration polarization within the current increasing region.

$$Vcz=(a3-a1)I^2 \qquad (6a)$$

Thus, a voltage drop Vczn due to the concentration polarization at any current In is given by:

$$Vczn=(a3-a1)In^2 \qquad (6b)$$

Therefore, a concentration polarization resistance Rcz in the current increasing region is given by:

$$Rczn=(a3-a1)In \qquad (6c)$$

Generally, a base resistance of the battery, which is not related to a chemical reaction in the battery, is constant when a state of charge and temperature is not varying. That is, the base resistance is constant during one operation of the starter motor. On the contrary, an activation polarization resistance of the battery is related to a chemical reaction including transfer of ions and electrons, so that the activation polarization has a relation with the concentration polarization of the battery.

Next, a deduction method of a concentration polarization of the battery in the current deceasing region will be discussed.

Two points A and B other than the peak are selected, and VpolcA and VpolcB which are respectively a voltage drop due to a concentration polarization at point A or B are given by:

$$VpolcA=[(Asec \text{ integration from zero to point } A)/(Asec \text{ in all discharge current region})] \times Vpolc0 \qquad (7)$$

or more simply $$VpolcA=[Ta(\text{time from the peak to point } A)/Tg] \times (Vpolc0-VpolcP) \qquad (7')$$

$$VpolcB=[(Asec \text{ integration from zero to point } B)/(Asec \text{ in all discharge current region})] \times Vpolc0 \qquad (8)$$

or more simply $$VpolcB=[Tb(\text{time from the peak to point } B)/Tg] \times (Vpolc0-VpolcP) \qquad (8')$$

Figure 9:
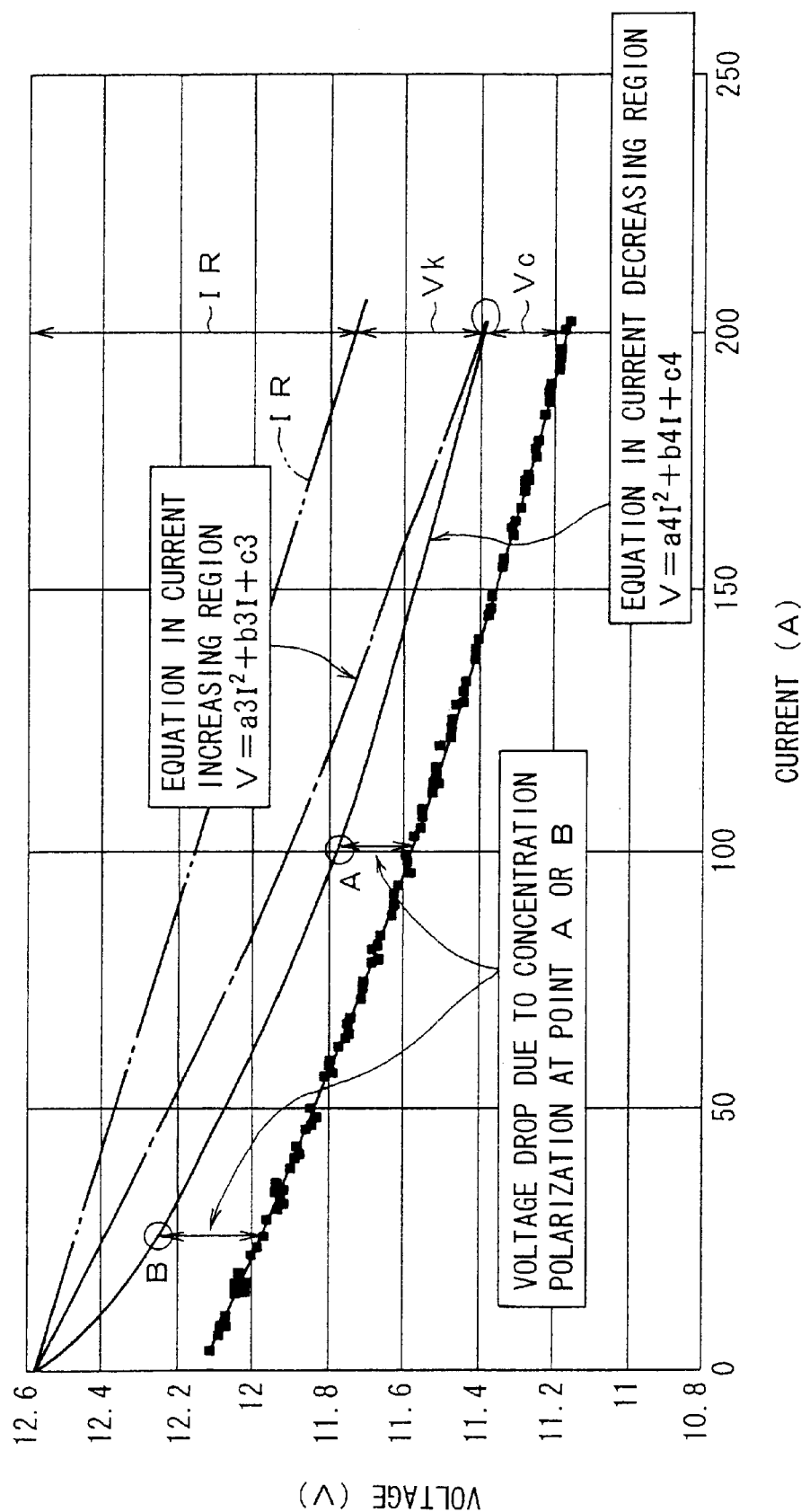
FIG. 9 is a graph particularly showing how to deduct a voltage drop due to a concentration polarization of the battery from the other of the approximate equations within a current decreasing region.

The voltage drops due to the concentration polarization at point A and at point B, which are obtained by the equations (7) and (8), are deducted from equation (2). In use of ordinates at points A, B and the peak, a voltage drop curve due to the base resistance and the activation polarization resistance within the current decreasing region is obtained. The curve is shown hereunder and is illustrated in FIG. 9

$$V=a4I^2+b4I+c4 \qquad (9)$$

The constants a4, b4, and c4 are determined since the equation (9) complies with the ordinates at points A, B and the peak. Note that c4 is equal to c1.

Equation (1) is deducted from equation (9) related to the base resistance and the activation polarization resistance to obtain the following approximate equation which shows a voltage drop due to the concentration polarization within the current decreasing region.

$$Vcg=(a4-a1)I^2+(b4-b1)I \qquad (10a)$$

That is, a voltage drop Vcgn due to the concentration polarization at a current In within the current decreasing region is given by:

$$Vcgn=(a4-a1)In^2+(b4-b1)In \qquad (10b)$$

Thus, an activation polarization resistance Rcg within the current decreasing region is given by the following equation which shows that Rcg varies with the current.

$$Rcg=(a4-a1)In+(b4-b1) \qquad (10c)$$

Accordingly, a voltage drop due to the concentration polarization at any current can be calculated separately from the other voltage drops.

Next, a computing method for obtaining a base resistance of the battery will be discussed. A difference between equation (5) used within the current increasing region and equation (9) used within the current decreasing region is due to an activation polarization of the battery. Therefore, if a deduction of a voltage drop due to the activation polarization is possible, a base resistance would be obtained.

In view of the peak point where a voltage drop included in equation (5) is the same as that of equation (9), a differential R1 of equation (5) and a differential R2 of equation (9) are given by:

$$R1=2 \times a3 \times Ip+b3 \tag{11a}$$

$$R2=2 \times a4 \times Ip+b4 \tag{11b}$$

For example, a discharge current of a battery is simulatively increased from zero to a peak of 200 A during 0.25 seconds and is decreased from the peak to zero during 0.25 seconds. In that case, differentials R1 and R1 at the peak are substantially equal to each other. Therefore, it is practical to obtain a base resistance R by the following equation because R is at least an intermediate value between R1 and R2.

$$R=(R1+R2)/2 \tag{12}$$

In a case of a battery mounted on a vehicle, for example, a DC starter motor has a field coil to which an electrical power is supplied from the battery. At cranking of an engine of the vehicle, a rush current in the field coil increases only during a short time of 3 milliseconds. Thus, a concentration polarization does not occur within the current increasing region. On the contrary, a current decreasing region is 150 milliseconds so that a considerable concentration polarization occurs. However, data obtained in an unstable state of the engine cranking is not used for determining the characteristics between current and voltage of the battery terminals.

Figure 10:
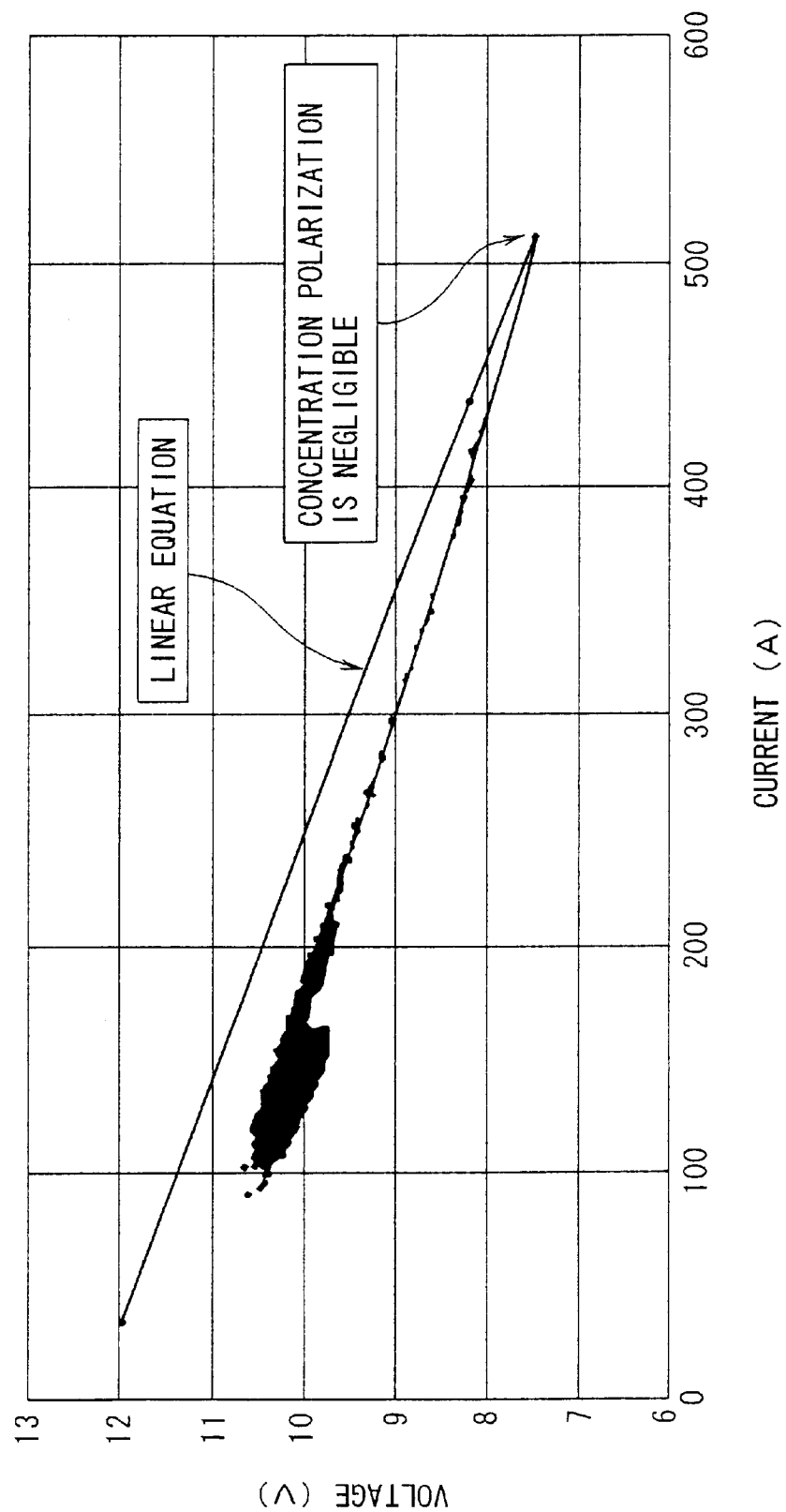
FIG. 10 is a graph showing a relation between a current and a voltage of the battery, the relation being given by an approximate linear equation within a current increasing region.

As illustrated in FIG. 10, the terminal voltage can be given approximately by a line up to a peak in the current increasing region.

In such a case, it is not preferable to obtain R by the equation (12). Because, an amount of the activation polarization is abnormally different between the current increasing region and the current decreasing region.

Therefore, it is preferable that time lengths of the current increasing region and the current decreasing region are used to obtain R at the peak. That is, R1 is multiplied by a first ratio which is Tz/Ts, while R2 is multiplied by a second ratio which is Tg/Ts to obtain R.

Thus obtained R provides a voltage drop line due to the base resistance as illustrated in FIG. 9, which can provide a voltage drop due to the base resistance at a desired point of the current.

By deducting thus obtained base resistance from equation (5), a voltage drop due to the activation polarization within the current increasing region is given by the following approximate equation.

$$Vkz=a3I^2+(b1-R)I \tag{13a}$$

Therefore, a voltage drop Vkn due to the activation polarization at any current In within the current increasing region is given by:

$$Vkn=a3In^2+(b1-R)In \tag{13b}$$

An activation polarization resistance Rkz within the current increasing region is given by the following equation, and Rkz varies with the current.

$$Rkz=a3In+(b1-R) \tag{13c}$$

By deducting thus obtained base resistance from equation (9) a voltage drop due to the activation polarization within the current decreasing region is given by the following approximate equation.

$$Vkg=a4I^2+(b4-R)I \tag{14a}$$

Therefore, a voltage drop Vgn due to the activation polarization at any current In within the current decreasing region is given by:

$$Vgn=a4In^2+(b4-R)In \tag{14b}$$

An activation polarization resistance Rkg within the current decreasing region is given by the following equation, and Rkg varies with the current.

$$Rkg=a4In+(b4-R) \tag{14c}$$

Thus, a voltage drop due to the activation polarization at any current can be calculated separately from the other factors of the battery voltage drop.

In recent vehicles, a three-phase AC motor with no brash is employed. This AC motor requires a comparatively longer time of about 100 milliseconds to reach a peak of a rush current. Thus, a voltage drop curve within the current increasing region is approximately given by a quadratic equation like the foregoing simulative discharging pattern.

Figure 11:
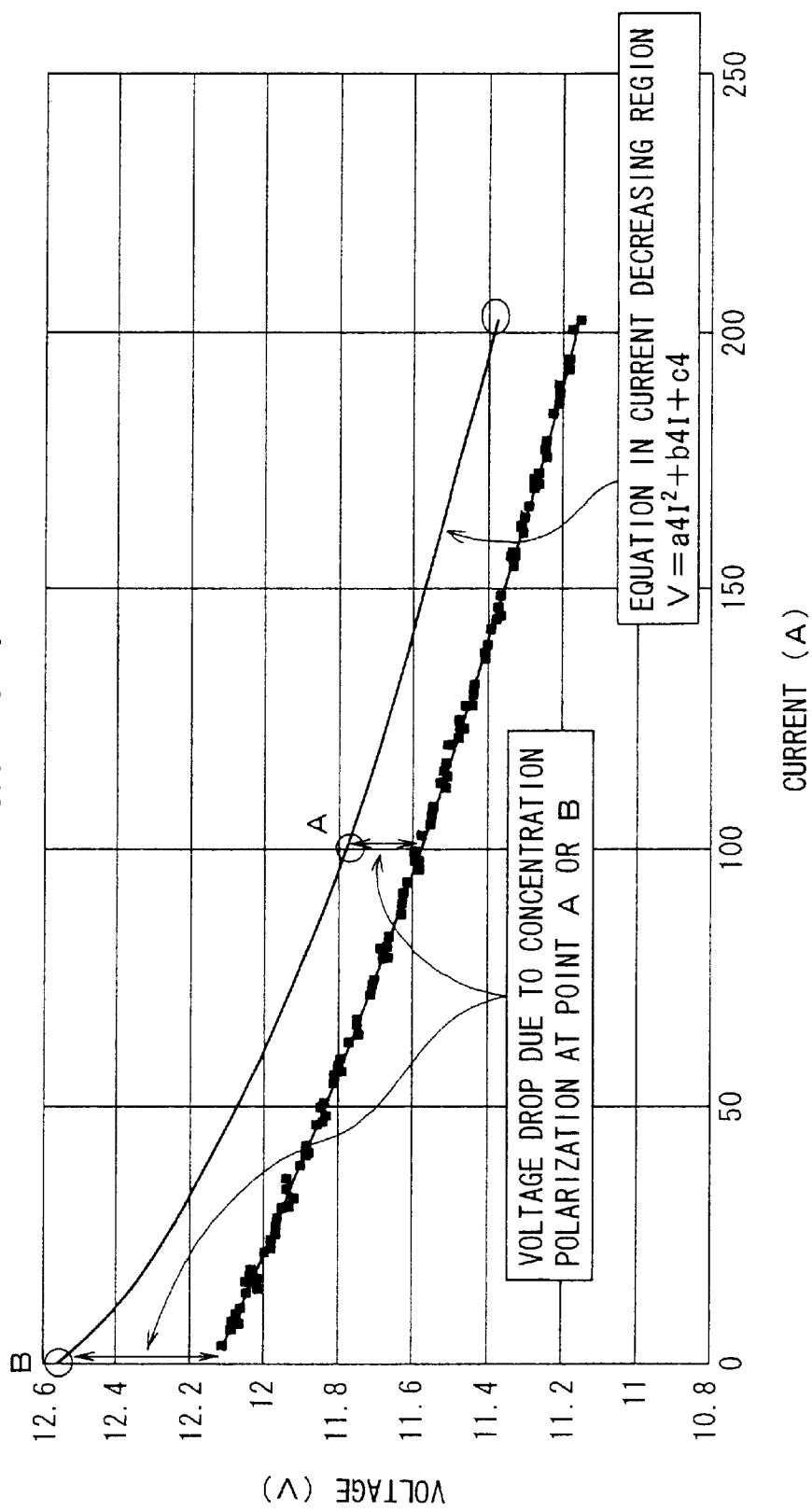
FIG. 11 is a graph particularly showing how to deduct a voltage drop due to a concentration polarization of the battery from one of the approximate equations within a current decreasing region.

To obtain an approximate equation of an activation polarization within the current decreasing region, point B where the current is zero is selected as one of the three coordinates including the peak point as illustrated in FIG. 11. This selection simplifies a process for obtaining the approximate equation.

Figure 12:
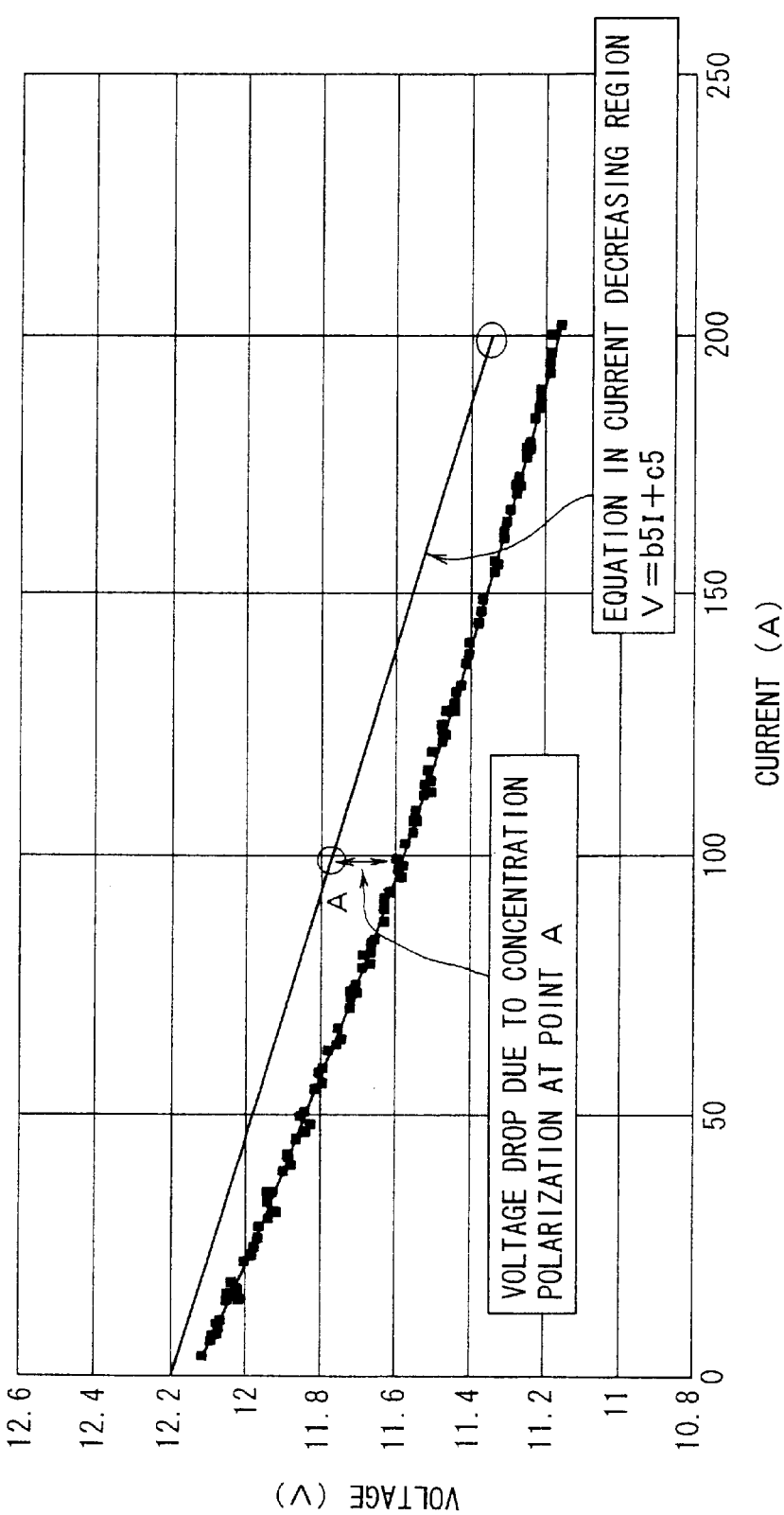
FIG. 12 is another graph particularly showing how to deduct a voltage drop due to a concentration polarization of the battery from one of the approximate equations within a current decreasing region.

Alternatively, to obtain an approximate equation of an activation polarization within the current decreasing region, point A where the current is about a half of the peak current is selected as one of the coordinates including the peak point as illustrated in FIG. 12. In this case, the approximate equation of an activation polarization within the current decreasing region may be obtained by a line connecting point A and the peak point.

In summary of the aforementioned methods, approximate equations of a voltage drop without effects of the concentration polarization is provided in a first step. Next, a voltage drop due to the concentration polarization is obtained by deducting the first step approximate equation from the total original approximate equations derived from the measured data. Next, from differentials of the first approximate equations at the peak point, a base resistance R, which is constant, is obtained. Approximate equations of a voltage drop due to the activation polarization approximate equations are obtained by further deducting RI from the first step approximate equations.

Next, a calculating method of a base resistance of a battery mounted on a vehicle will be discussed in detail. The battery supplies an electrical power to a starter motor through which a rush current flows with an activation polarization of the battery both in a current increasing region and in a current deceasing region of the battery.

After the starting of the battery, a discharge current of the battery increases up to a peak and deceases monotonically toward a constant current. The battery is measured regarding its discharge current and terminal voltage at 100 µsec intervals of to obtain data thereof.

A latest set of the data of the discharge current and terminal voltage corresponding to a period is stored in a memory such as a RAM. In use of the set of data stored in the memory, two approximate quadratic equations shown by equations (1) and (2) are obtained by a least-squares method, which shows the relation between the discharge current and the terminal voltage. From the two approximate quadratic equations, a voltage drop due to a concentration polarization of the battery is deducted.

At a zero (A) point of the discharge current, a voltage difference between the two approximate equations (1) and (2) is calculated. The voltage difference is provided by a concentration polarization of the battery, because a voltage drop due to a base resistance and an activation polarization does not occur at the zero point of the discharge current. In use of the voltage difference, a voltage drop is obtained at the peak point by equation (1) within the current increasing region.

Next, in use of the voltage drop at the peak point, equation (4) showing a voltage drop due to only the base resistance and the activation polarization is developed. Then, equation (5) for the current increasing region is obtained in use of equations (1) and (4).

Next, from equation (2) for the current decreasing region, an approximate equation without a concentration polarization is obtained. In this process, the peak point and other two points are utilized, and effects of the concentration polarization are deducted. Thereby, a modified quadratic approximate equation (9) is obtained.

Each of thus obtained approximate quadratic equations (5) and (9) is deducted from each of equations (1) and (2) to obtain concentration polarization approximate equations (6a) and (10a). Then, a base resistance R is calculated, and IR is deducted from each of the approximate quadratic equations (13a) and (14a). Thereby, activation polarization approximate equations (13) and (14a) are obtained.

The base resistance R is calculated by equations (11a) and (11b) with the aforementioned modification related to lengths of the current increasing and decreasing regions.

For example, when the current increasing time is 3 milliseconds and the current decreasing time is 100 milliseconds, a base resistance is given by:

$$R = Rpolk1 \times 3/103 + Rpolk2 \times 100/103$$

where

Rpolk1: a differential at the peak in the current increasing region

Rpolk2: a differential at the peak in the current decreasing region

Figure 1:
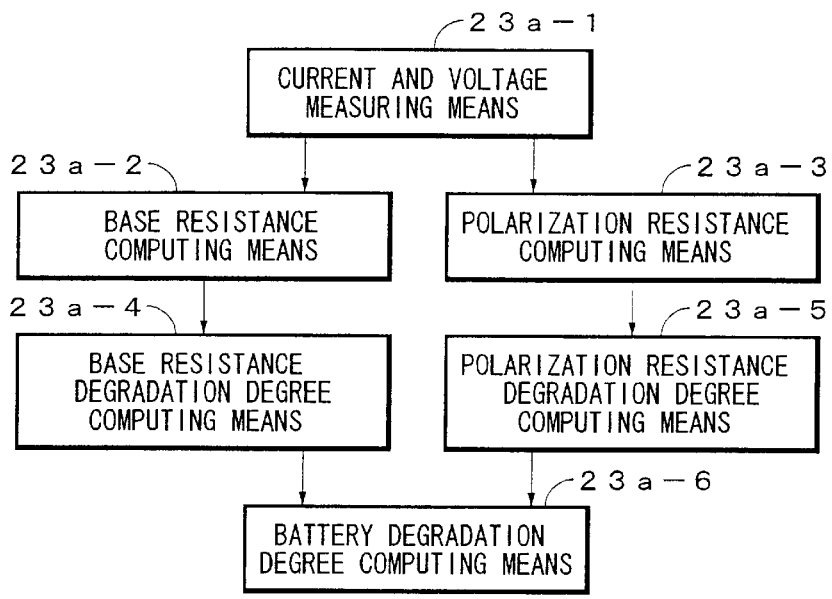
FIG. 1 is a basic block diagram of a degradation degree calculating unit according to the invention of a battery mounted on a vehicle.
Figure 2:
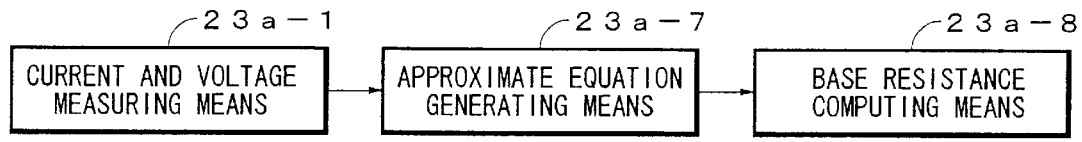
FIG. 2 is a basic block diagram of a device for obtaining a base resistance of the battery when the battery is new or in a degradation state.
Figure 4:
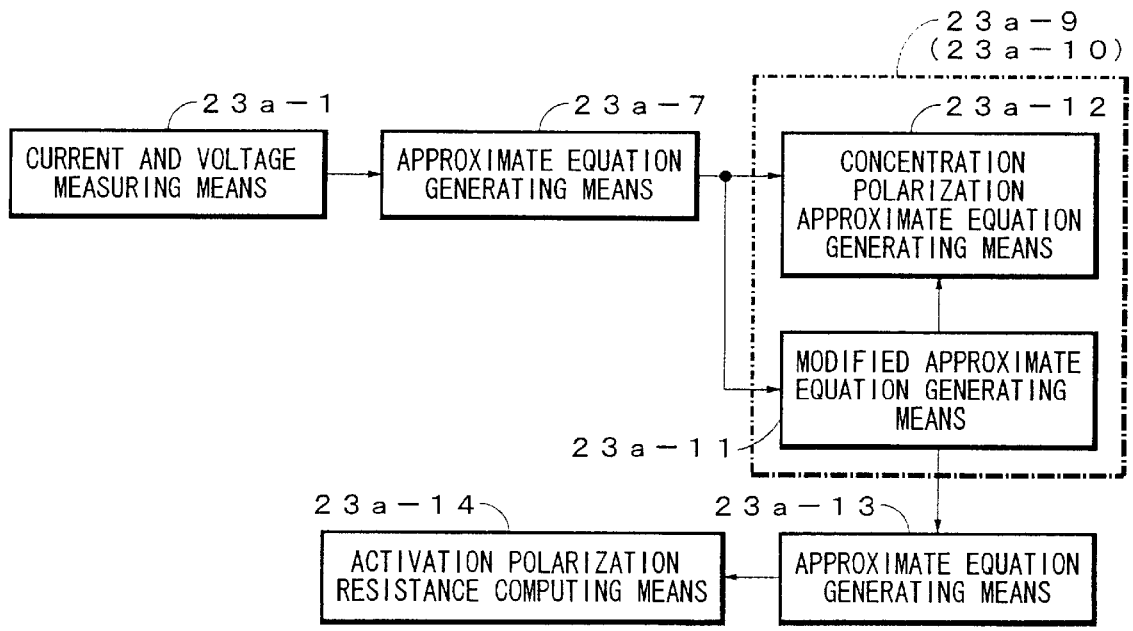
FIG. 4 is a basic block diagram of a device for obtaining an activation polarization resistance of the battery when the battery is new or a degradation state.
Figure 3:
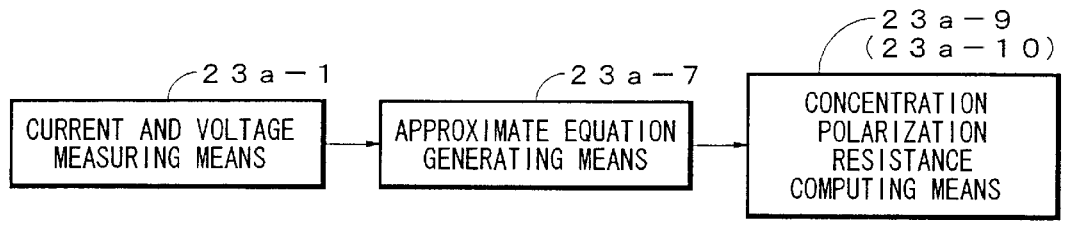
FIG. 3 is a basic block diagram of a device for obtaining a concentration polarization resistance of the battery when the battery is new or in a degradation state.
Figure 5:
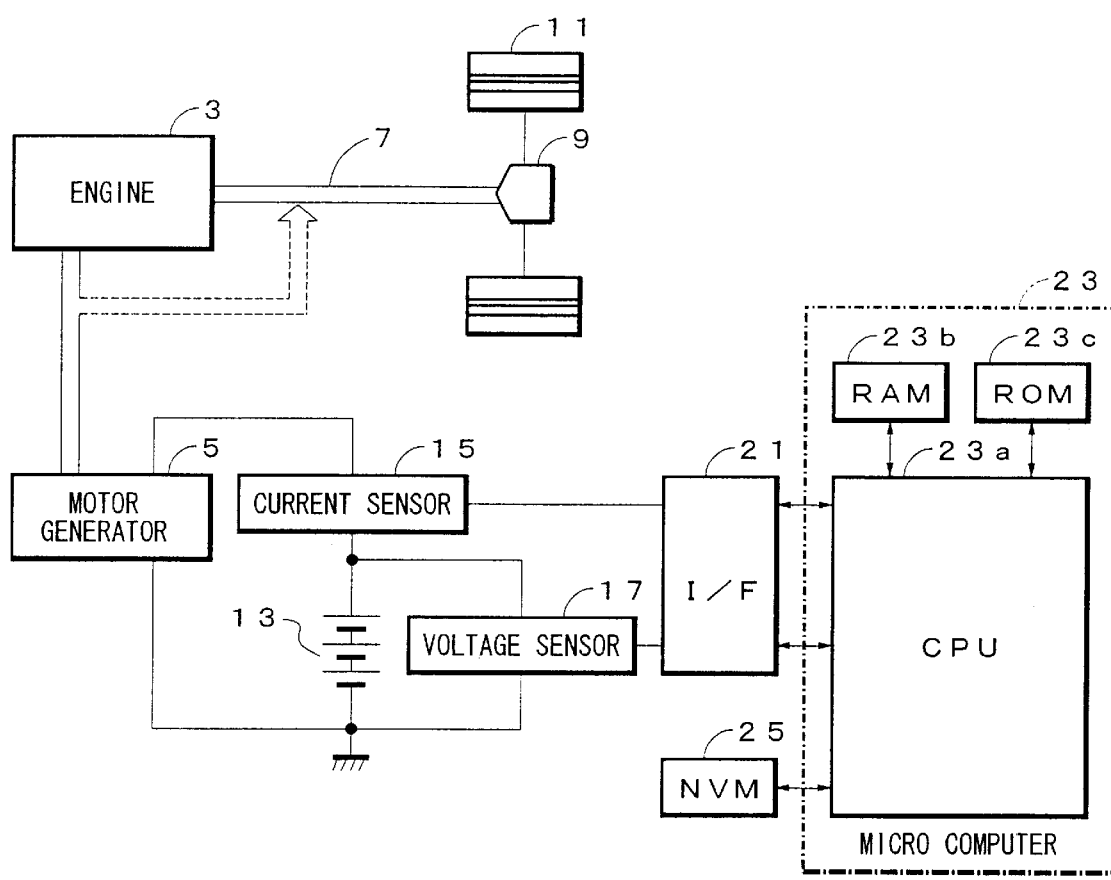
FIG. 5 is an illustration showing a general configuration of the unit, which is partially a block diagram.

Referring to FIG. 5, an embodiment of a unit according to the present invention for carrying out a degradation degree computing method for a battery mounted on a vehicle will be discussed hereinafter.

FIG. 5 is an illustration showing a general configuration of the unit, which is partially a block diagram. Reference numeral 1 designates the unit which is mounted on a hybrid vehicle having a motor generator 5 in addition to an engine 3.

The hybrid vehicle normally moves by transferring an output of the engine 3 to wheels 11 via a shaft 7 and a differential gear 9. In a high load state of the vehicle, the motor generator 5 is driven to act as a motor by an electrical power supplied from a battery 13. The motor generator 5 assists the output of the engine 3 to drive the wheels 11 via the shaft 7.

In a deceleration or braking state of the hybrid vehicle, the motor generator 5 serves as a generator to change a partial energy of the engine to an electric power for charging the battery 13.

Furthermore, the motor generator 5 functions as a starter motor to forcibly rotate a flywheel of the engine 3 at starting of the engine 3 when a starter switch (not shown) is turned on. At that time, a large rush current flows during a short time through the motor generator 5. After the engine 3 is moved by the motor generator 5, the starter switch is turned off in response to releasing of an ignition key (not shown), and an ignition switch is turned on as well as an accessory switch. In this state, a discharge current from the battery 13 becomes constant.

The unit 1 has a current sensor 15 and a voltage sensor 17. The current sensor is used for sensing a discharge current I supplied from the battery 13 to electrical equipment including the motor generator 5 and a charging current supplied from the motor generator 5 to the battery 13. The voltage sensor 17 has a resistance of about 1 MÜ for sensing a voltage between a pair of terminals of the battery 13.

Furthermore, the unit 1 includes a micro computer 23 and a non-volatile memory (NVM) 25. The microcomputer 23 receives outputs of the current sensor 15 and the voltage sensor 17 via an interface circuit (I/F) 21 after an A/D conversion of the outputs.

The micro computer 23 has CPU 23a, RAM 23b, and ROM 23c. The micro computer 23 is electrically connected to the I/F 21, the starter switch, the ignition switch, the accessory switch, and other switches for electrical equipment (loads).

RAM 23b has a data area for storing various data and a working area for various processes, and CPU 23a stores a control program for executing the processes.

A current and a voltage, which are output from the current sensor 15 or the voltage sensor 17, are sampled at short intervals to be transmitted to CPU 23a of the micro computer 23 via I/F 21. Thus transmitted current and voltage are stored in a data area of RAM 23b to be used in various processes.

The NVM 25 preliminarily stores a data related to a base resistance, an activation polarization resistance, and a concentration polarization resistance corresponding to a predetermined discharge current of the battery 13 which is in a new state with no degradation.

Next, referring to a flowchart of FIG. 13, processes of CPU 23a along a control program stored in ROM 23c will be discussed hereinafter.

An electrical power supplied from the battery energizes the micro computer 23, so that the program in CPU 23a starts and executes an initial set (step S1).

After the initial set of step S1, CPU 23a determines whether the ignition switch has been turned on (step S2). When the decision is NO, another step is executed (step S3). Step S3 includes a work for obtaining discharge currents and terminal voltages at 500 µsec sampling intervals, and this process is repeated until the decision of step S2 becomes YES. When the ignition switch is turned on, the sampling interval is decreased from 500 µsec to 100 µsec (step S4) so that a rush current sharply varying at the starting of the starter motor can be sensed.

The discharge current I sensed by the sensor 15 and the terminal voltage V sensed by the voltage sensor 15 are processed by an A/D converter to be input into CPU 23a via I/F 21. The input data is stored in a data area of RAM 23b (step S5).

During step S5 for storing the data, each data is compared with a next one in magnitude to find a peak of the rush current (step 6). When a peak is found (YES in step S6), the storing of the data is continued until a predetermined time elapses from the peak. After the predetermined time has elapsed (Yes in step S7), the data across the peak is stored (step S8). After the predetermined time, the sampling interval is brought back to 500 μsec (step S9).

The stored data of the current and voltage is analyzed whether the data is appropriate for obtaining an approximate equation by a least-squares method. That is, the data is analyzed whether the discharge current increases to the peak and decreases to a constant current along a simple pattern (step S10).

When step S11 determines that the analyzed data is appropriate, step S12 sets up quadratic approximate equations (1) and (2) showing relations between the current and the voltage respectively in the current increasing or decreasing region (step S12).

In use of the quadratic approximate equations developed in step S12, step S13 obtains approximate equations of the concentration polarization, abase resistance, and approximate equations of the activation polarization. Then, voltage drops respectively due to the concentration polarization or the activation polarization are calculated at predetermined current points by the obtained approximate equations. At the predetermined current points, values of the activation polarization resistance, the concentration polarization resistance, and the base resistance are calculated. Note that NVM 25 has stored values of the activation polarization resistance, the concentration polarization resistance, and the base resistance at the predetermined current points of a new battery.

Preferably, one of the predetermined points is selected such that the concentration polarization is maximum or saturated at the point in the current decreasing region. Because, the concentration polarization tends to delay relative to the increase of the discharge current.

The values of the activation polarization, the concentration polarization resistance, and the base resistance, which are calculated in step S13, are respectively divided by corresponding initial values stored in NVM 25. Thus, a ratio of a present value to an initial value concerning each of the activation polarization resistance, the concentration polarization resistance, and the base resistance is obtained. Thus obtained ratios are multiplied together to provide a total degradation degree of the battery (step S14). The total degradation degree is stored in a data area of RAM 23*b*. After step S15, the execution retunes to step S2.

In the degradation degree computing unit 1 for a battery according to the present invention, step S5 of the flowchart is a process corresponding to the current and voltage measuring means. Step S13 is a process corresponding to the base resistance computing means 23*a*-2 and the polarization resistance computing means 23*a*-3. Step S14 corresponds to the base resistance degradation degree computing means 23*a*-4, the polarization resistance degradation degree computing means 23*a*-5, and the multiplying means 23*a*-6.

Furthermore, step S12 corresponds to the approximate equation generating means 23*a*-7, and step S13 corresponds to the base resistance computing means 23*a*-8, the concentration polarization resistance computing means 23*a*-9, the concentration polarization resistance computing means 23*a*-10, the modified approximate equation generating means 23*a*-11, the concentration polarization approximate equation generating means 23*a*-12, the activation polarization approximate equation generating means 23*a*-13, and the activation polarization resistance computing means 23*a*-14.

Next, thus configured battery degradation degree computing unit 1 according to the present invention will be discussed in operation thereof.

First, the discharge current and the terminal voltage are measured at regular intervals while a rush current flows, e.g. through a starter from the battery 13.

The rush current increases initially up to a peak and then decreases from the peak to a constant value. RAM 23*a* stores the data of the discharge current I and the terminal voltage V. The data has been obtained within a predetermined period across the peak. The data is analyzed whether the data is appropriate for obtaining approximate equations by a least-squares method.

The analysis may not be carried out at the same time as the measurement of the discharge current and the terminal voltage of the battery.

In the aforementioned embodiment, a rush current of a starter motor within a period just after the starting of the starter is employed. However, another load with a rush current at its start may be employed as well as the starter motor. In this case, step S4 is executed in response to an operation of a switch of the load in place of the ignition switch. The other processes are substantially the same as those of the flowchart of FIG. 13.

Thus obtained degradation degree of the battery 13 is used for a discharge capacity management of the battery.

In the battery degradation degree computing unit 1 according to the present invention, an approximate equation showing a relation between the discharge current and the terminal voltage is obtained. In use of the approximate equation, the present values of the activation polarization resistance, the concentration polarization resistance, and the base resistance are respectively divided by a corresponding initial value of the battery at predetermined current points. Thus, a ratio of a present value to an initial value concerning each of the activation polarization resistance, the concentration polarization resistance, and the base resistance is obtained. Thus obtained ratios are multiplied together to provide a total degradation degree of the battery to generally know the degradation degree of the battery 13.

The unit can consider the relations among a base resistance, an activation polarization resistance, and a concentration polarization resistance of the battery, and the measurement of the battery can be made while the battery is kept on the vehicle.

What is claimed is:

1. A degradation degree computing method for a battery for supplying an electrical power to a load, the method comprising the steps of:

a first step for obtaining a base resistance of the battery by cyclically measuring a discharge current and a voltage between a pair of terminals of the battery while a rush current is flowing in an electric load electrically connected to the pair of terminals, the rush current monotonically decreasing from a peak to a constant value after the rush current monotonically increases from zero to the peak, a second step for obtaining at least one of a concentration polarization resistance and an activation polarization resistance of the battery from the discharge current and the terminal voltage that are measured in the first step, a third step for obtaining a degradation degree of the base resistance which is a ratio of the base resistance obtained by the first step to an original base resistance of the battery, a fourth step for obtaining a polarization resistance degradation degree which is a ratio of one of the concentration polarization resistance and the activation polarization resistance to an original polarization resistance, and a fifth step for obtaining a degradation degree of the battery by multiplying the base resistance degradation degree and the polarization resistance degradation degree together.

2. The method set forth in claim 1, the second step obtains each of the concentration polarization resistance and the activation polarization resistance of the battery, and an fourth step obtains a concentration polarization resistance degradation degree which is a ratio of the concentration polarization resistance obtained in the second step to an original concentration polarization resistance of the battery, the fourth step also obtaining an activation polarization resistance degradation degree which is a ratio of the activation polarization resistance obtained in the second step to an original activation polarization resistance of the battery, wherein the polarization resistance degradation degree of the fifth step is obtained by multiplying the degradation degrees of the concentration polarization resistance and the activation polarization resistance together.

3. A degradation degree computing unit of a battery for supplying an electrical power to a load, the unit comprising:

a measuring means for measuring a discharge current and a voltage between a pair of terminals of the battery while a rush current is flowing in an electric load electrically connected to the pair of terminals, the rush current monotonically decreasing from a peak to a constant value after the rush current monotonically increases from zero to the peak, a base resistance computing means for obtaining a base resistance of the battery from the discharge current and the voltage that are measured by the measuring means, a polarization resistance computing means for obtaining at least one of a concentration polarization resistance and an activation polarization resistance of the battery from the discharge current and the terminal voltage that are measured by the measuring means, a base resistance degradation degree computing means for obtaining a degradation degree of the base resistance which is a ratio of the base resistance obtained by the base resistance computing means to an original base resistance of the battery, a polarization resistance degradation degree computing means for obtaining a polarization resistance degradation degree which is a ratio of one of the concentration polarization resistance and the activation polarization resistance to an original polarization resistance, and a battery degradation degree computing means for obtaining a degradation degree of the battery by multiplying the base resistance degradation degree and the polarization resistance degradation degree together.

4. The unit set forth in claim 3, the polarization resistance computing means calculates each of the concentration polarization resistance and the activation polarization resistance of the battery, and the polarization resistance degradation degree computing means calculates a concentration polarization resistance degradation degree which is a ratio of the concentration polarization resistance obtained by the polarization resistance computing means to an original concentration polarization resistance of the battery, the polarization resistance degradation degree computing means also calculating an activation polarization resistance degradation degree which is a ratio of the activation polarization resistance obtained by the polarization resistance computing means to an original activation polarization resistance of the battery, wherein the battery degradation degree computing means obtains a degradation degree of the battery by multiplying the degradation degrees of the base resistance, the concentration polarization resistance, and the activation polarization resistance together.

* * * * *